(12) United States Patent
Kang et al.

(10) Patent No.: US 9,356,083 B2
(45) Date of Patent: *May 31, 2016

(54) ORGANIC LIGHT-EMITTING DISPLAY APPARATUS AND METHOD OF MANUFACTURING THE SAME

(71) Applicant: Samsung Display Co., Ltd., Yongin, Gyeonggi-do (KR)

(72) Inventors: Ki-Nyeng Kang, Yongin (KR); Jae-Beom Choi, Yongin (KR); Soo-Beom Jo, Yongin (KR)

(73) Assignee: Samsung Display Co., Ltd., Yongin, Gyeonggi-Do (KR)

(*) Notice: Subject to any disclaimer, the term of this patent is extended or adjusted under 35 U.S.C. 154(b) by 0 days.

This patent is subject to a terminal disclaimer.

(21) Appl. No.: 14/822,819

(22) Filed: Aug. 10, 2015

(65) Prior Publication Data

US 2015/0349037 A1    Dec. 3, 2015

Related U.S. Application Data

(63) Continuation of application No. 13/961,077, filed on Aug. 7, 2013, now Pat. No. 9,136,312.

(30) Foreign Application Priority Data

Jan. 2, 2013  (KR) .......................... 10-2013-0000250

(51) Int. Cl.
*H01L 27/32* (2006.01)
*H01L 51/50* (2006.01)
*H01L 51/52* (2006.01)
*H01L 51/00* (2006.01)
*H01L 51/56* (2006.01)

(52) U.S. Cl.
CPC .......... *H01L 27/3248* (2013.01); *H01L 27/326* (2013.01); *H01L 27/3211* (2013.01); *H01L 27/3246* (2013.01); *H01L 51/5072* (2013.01); *H01L 51/5088* (2013.01); *H01L 51/5228* (2013.01); *H01L 51/0011* (2013.01); *H01L 51/56* (2013.01); *H01L 2227/323* (2013.01)

(58) Field of Classification Search
CPC .......................... H01L 27/3246; H01L 27/326
See application file for complete search history.

(56) References Cited

U.S. PATENT DOCUMENTS

2006/0170339 A1  8/2006  Kanno
2012/0146064 A1  6/2012  Ishikawa

FOREIGN PATENT DOCUMENTS

| | | |
|---|---|---|
| JP | 2007-026684 | 2/2007 |
| KR | 2003-0012132 A | 2/2003 |
| KR | 2012-0065230 | 6/2012 |

*Primary Examiner* — Amar Movva
(74) *Attorney, Agent, or Firm* — Knobbe Martens Olson & Bear LLP

(57) ABSTRACT

Provided is a method of manufacturing an organic light-emitting display apparatus which may reduce white angular dependency (WAD). The method includes forming a common layer on each of subpixel areas at the same time without discretion within one pixel area, the common layer not being formed on connection areas between pixel areas.

12 Claims, 11 Drawing Sheets

ORGANIC LIGHT-EMITTING DISPLAY APPARATUS AND METHOD OF MANUFACTURING THE SAME

CROSS-REFERENCE TO RELATED APPLICATIONS

This application is a continuation of U.S. patent application Ser. No. 13/961,077 filed Aug. 7, 2013, which claims priority to and the benefit of Korean Patent Application No. 10-2013-0000250, filed on Jan. 2, 2013, in the Korean Intellectual Property Office, the entire contents of both of which are incorporated herein by reference.

BACKGROUND

1. Field

The present embodiments relate to a method of manufacturing an organic light-emitting display apparatus.

2. Description of the Related Technology

Recently, portable thin flat panel display devices have become popular. From among flat panel display apparatuses, organic light-emitting display apparatus have attracted attention as next-general display apparatuses because of their wide viewing angle, high contrast, and fast response time.

An organic light-emitting display apparatus includes an intermediate layer, a first electrode, and a second electrode. The intermediate layer includes an organic emission layer, and the organic emission layer generates visible light when a voltage is applied to the first electrode and the second electrode.

SUMMARY

The present embodiments provide a method of manufacturing an organic light-emitting display apparatus which may reduce white angular dependency (WAD).

According to an aspect of the present embodiments, there is provided a method of manufacturing an organic light-emitting display apparatus, the method including: preparing a substrate having a plurality of connection areas and a plurality of pixel areas each of which has a plurality of subpixel areas; forming at least one thin film transistor (TFT) on each of the subpixel areas; forming a pixel electrode to correspond to each of the subpixel areas, the pixel electrode being electrically coupled to the TFT; forming a connection electrode to correspond to each of the connection areas, the connection electrode being spaced part from the pixel electrode; forming a first common layer on each of the pixel areas to cover the pixel electrodes; forming an emission layer on the first common layer to correspond to each of the subpixel areas; forming a second common layer on each of the pixel areas to cover the emission layer; and forming a counter electrode that covers the second common layer and contacts the connection electrode.

The subpixel areas may include one of a red subpixel area, a green subpixel area, and a blue subpixel area.

One pixel area may include the red subpixel area, the green subpixel area, and the blue subpixel area.

The forming of the first common layer may include: performing a first mask process of forming the first common layer on any one pixel area and on the pixel areas disposed in diagonal directions to said any one pixel area from among the plurality of pixel areas; and performing a second mask process of forming the first common layer on the pixel areas on which the first common layer is not formed even after the first mask process.

The performing of the first mask process may include not forming the first common layer on the pixel areas adjacent in all directions except the diagonal directions to said any one pixel area from among the plurality of pixel areas.

The performing of the first mask process may include: preparing a first mask in which openings are formed to correspond to the pixel areas; aligning the first mask to the substrate such that the openings are located on the pixel areas; and forming the first common layer on the pixel areas by using the openings.

In the first mask for forming the first common layer, the openings may be formed to correspond to said any one pixel area and the pixel areas disposed in diagonal directions to said any one pixel area from among the plurality of pixel areas, and the openings may not be formed to correspond to the pixel areas adjacent in all directions except the diagonal directions to said any one pixel area from among the plurality of pixel areas.

In the first mask for forming the first common layer, the openings may not be formed to correspond to the connection areas.

The performing of the second mask process may include: preparing a second mask in which openings are formed to the pixel areas on which the first common layer is not formed by using the first mask process; aligning the second mask to the substrate such that the openings are located on the pixel areas; and forming the first common layer on the pixel areas by using the openings.

A thickness of the first common layer or the second common layer formed on the subpixel areas within one pixel area may be substantially uniform on the subpixel areas.

The first common layer may be a hole injection layer.

The forming of the second common layer may include: performing a third mask process of forming the second common layer on any one pixel area and on the pixel areas disposed in diagonal directions to said any one pixel area from among the plurality of pixel areas; and performing a fourth mask process of forming the second common layer on the pixel areas on which the second common layer is not formed even after the third mask process.

The performing of the third mask process may include not forming the second common layer on the pixel areas adjacent in all directions except the diagonal directions to said any one pixel area from among the plurality of pixel areas.

The performing of the third mask process may include: preparing a third mask in which openings are formed to correspond to the pixel areas; aligning the third mask to the substrate such that the openings are located on the pixel areas; and forming the second common layer on the pixel areas by using the openings.

In the third mask for forming the second common layer, the openings may be formed to correspond to said any one pixel area and the pixel areas disposed in diagonal directions to said any one pixel area from among the plurality of pixel areas, and the openings may not be formed to the pixel areas adjacent in all directions except the diagonal directions to said any one pixel area from among the plurality of pixel areas.

In the third mask for forming the second common layer, the openings may not be formed to correspond to the connection areas.

The performing of the fourth mask process may include: preparing a fourth mask in which openings are formed to correspond to the pixel areas in which the second common layer is not formed by using the first mask process; aligning the fourth mask to the substrate such that the openings are located on the pixel areas; and forming the second common layer on the pixel areas by using the openings.

BRIEF DESCRIPTION OF THE DRAWINGS

The above and other features and advantages of the present embodiments will become more apparent by describing in detail example embodiments thereof with reference to the attached drawings in which.

DETAILED DESCRIPTION

As used herein, the term "and/or" includes any and all combinations of one or more of the associated listed items. Expressions such as "at least one of," when preceding a list of elements, modify the entire list of elements and do not modify the individual elements of the list.

The present embodiments will now be described more fully with reference to the accompanying drawings, in which example embodiments are shown.

Figure 1:
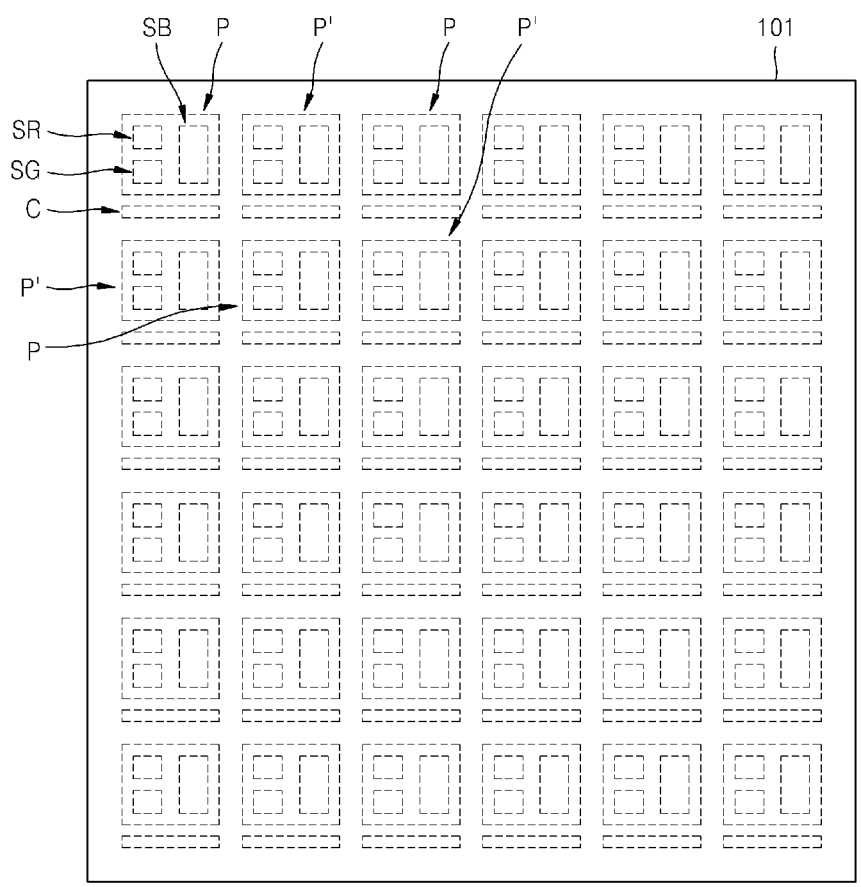
FIG. 1 is a plan view illustrating a substrate according to an embodiment.

FIGS. 1 through 15 are cross-sectional views for explaining a method of manufacturing an organic light-emitting display apparatus, according to an embodiment. FIG. 1 is a plan view illustrating a substrate 101 of the organic light-emitting display apparatus.

Referring to FIG. 1, the substrate 101 may include a plurality of pixel areas P and a plurality of connection areas C. Each of the pixel areas P may have a plurality of subpixel areas. The subpixel areas may include a red subpixel area SR, a green subpixel area SG, and a blue subpixel area SB. A longitudinal direction of each of the blue subpixel areas SB may be parallel to directions of two parallel sides of the substrate 101, and longitudinal directions of the red subpixel areas SR and the green subpixel areas SG may be parallel to directions of the remaining two parallel sides of the substrate 101. However, the present embodiment is not limited thereto, and each of the pixel areas P may be divided into a plurality of subpixels in a various ways.

A pixel electrode, a first common layer, an emission layer, and a second common layer may be stacked on each of the subpixel areas SR, SG, and SB, which will be explained below.

The substrate 101 may comprise a transparent glass material having $SiO_2$ as a main component. The substrate 101 is not limited thereto, and may comprise any of various materials such as a transparent plastic material or a metal material.

Figure 2:
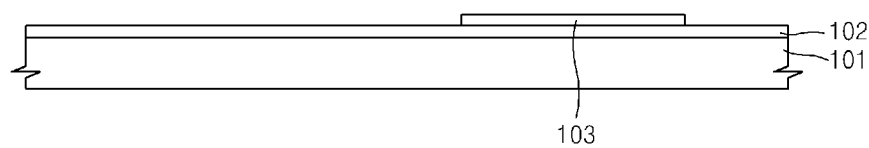
FIGS. 2 through 15 are cross-sectional views for explaining a method of manufacturing an organic light-emitting display apparatus, according to an embodiment.
Figure 3:
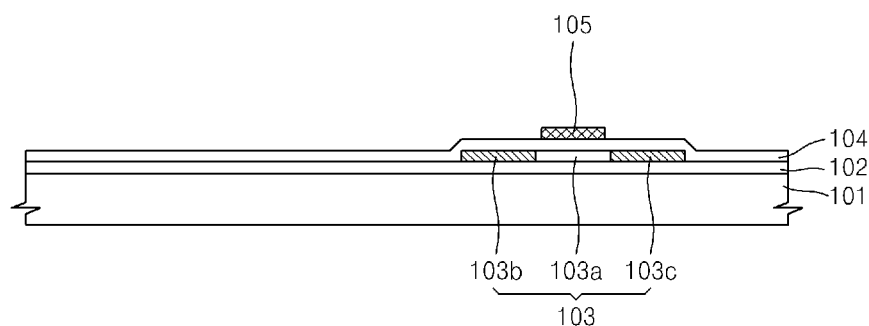

Referring to FIG. 2, an auxiliary layer 102 is formed on the substrate 101. The auxiliary layer 102 may prevent impurity ions from being diffused to a top surface of the substrate 101, may prevent penetration of moisture or external air, and may function as a barrier layer, a blocking layer, and/or a buffer layer for planarizing a surface of the substrate 101. The auxiliary layer 102 may comprise $SiO_2$ and/or SiNx by using any of various deposition methods such as plasma-enhanced chemical vapor deposition (PECVD), atmospheric pressure CVD (APCVD), or low-pressure CVD (LPCVD).

An active layer 103 of a thin film transistor (TFT) is formed on the auxiliary layer 102. In detail, a polycrystalline silicon layer (not shown) is formed by depositing an amorphous silicon layer (not shown) on the auxiliary layer 102 and then crystallizing the amorphous silicon layer. The amorphous silicon layer may be crystallized by using any of various methods such as rapid thermal annealing (RTA), solid phase crystallization (SPC), excimer laser annealing (ELA), metal induced crystallization (MIC), metal induced lateral crystallization (MILC), or sequential lateral solidification (SLS). The polycrystalline silicon layer is patterned into the active layer 103 of the TFT by using a mask process. Since at least one TFT is connected to a subpixel, at least one active layer 103 may be formed to correspond to a subpixel area.

Figure 4:
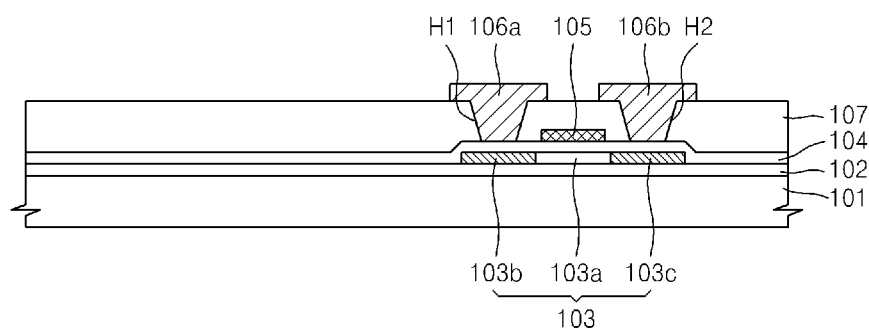

Referring to FIG. 4, a gate insulating film 104 is formed on an entire surface of the substrate 101 to cover the active layer 103, and a gate electrode 105 is formed on the gate insulating film 104 to correspond to the active layer 103.

The gate insulating film 104 may be formed by depositing an inorganic insulating film such as SiNx or SiOx by using PECVD, APCVD, or LPCVD. The gate insulating film 104 insulates the active layer 103 of the TFT from the gate electrode 105 by being disposed between the active layer 103 of the TFT and the gate electrode 105.

The gate electrode 105 is formed to correspond to the center of the active layer 103. A source region 103b and a drain region 103c on both sides of the gate electrode 105 and a channel region 103a between the source region 103b and the drain region 103c are formed by doping n-type or p-type impurities into the active layer 103 by using the gate electrode 105 as a self-aligned mask. The impurities may be boron (B) ions or phosphorus (P) ions.

The gate electrode 105 may include at least one material selected from the group consisting of silver (Ag), magnesium (Mg), aluminium (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), MoW, and copper (Cu). Alternatively, the gate electrode 105 may be formed to have a Mo—Al—Mo layer structure.

Referring to FIG. 4, an interlayer insulating film 107 is formed on the entire surface of the substrate 101 on which the gate electrode 105 is formed, and a source electrode 106a and a drain electrode 106b respectively connected to the source region 103b and the drain region 103c are formed.

The interlayer insulating film 107 may comprise at least one organic insulating material selected from the group consisting of polyimide, polyamide, acrylic resin, benzocyclobutene, and phenol resin by using spin coating. The interlayer insulating film 107 is formed to have a sufficient thickness, for example, a thickness greater than a thickness of the gate insulating film 104, and insulates the gate electrode 105 of the TFT from the source electrode 106a and the drain electrode 106b. The interlayer insulating film 107 may comprise an inorganic insulating material, like the gate insulating film 104, as well as the organic insulating material. Alternatively, the interlayer insulating film 107 may be formed by alternately arranging an organic insulating material and an inorganic insulating material.

Via holes H1 and H2 through which the source region 103b and the drain region 103c are exposed are formed in the interlayer insulating film 107. The via hole H1 exposes a portion of the source region 103b, and the via hole H2 exposes a portion of the drain region 103c.

After the via holes H1 and H2 are formed in the interlayer insulating film 107, a conductive layer (not shown) is formed on the interlayer insulating film 107 to fill the via holes H1 and H2. The conductive layer is formed as the source electrode 106a and the drain electrode 106b by being patterned by using a mask process.

Figure 5:
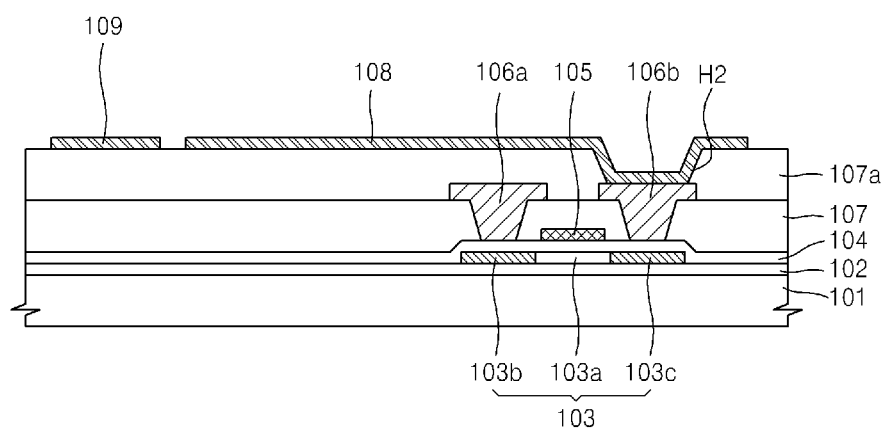

Referring to FIG. 5, a passivation film 107a is formed on the entire surface of the substrate 101 on which the source electrode 106a and the drain electrode 106b are formed. The passivation film 107a may comprise an inorganic insulating material. A contact hole H3 through which a portion of the drain electrode 106b is exposed is formed in the passivation film 107a. A pixel electrode 108 may be electrically coupled to the drain electrode 106b via the contact hole H3.

After the passivation film 107a is formed, a conductive layer (not shown) is formed on the passivation film 107a, and the pixel electrode 108 and a connection electrode 109 are formed by patterning the conductive layer. The pixel electrode 108 contacts the drain electrode 106b via the contact hole H3 as described above. The pixel electrode 108 and the connection electrode 109 may comprise the same material by using the same process.

Figure 6:
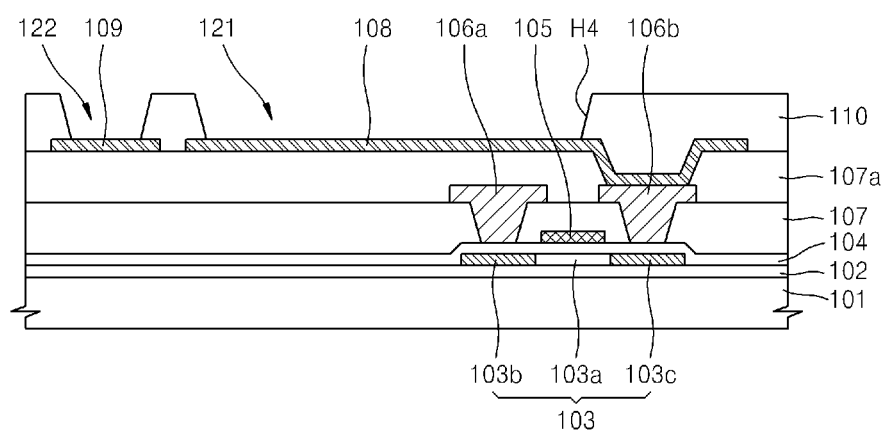

Referring to FIG. 6, a pixel defining layer (PDL) 110 is formed on the substrate 101.

In detail, an insulating layer (not shown) is formed on the entire surface of the substrate 101 on which the pixel electrode 108 and the connection electrode 109 are formed. In this case, the insulating layer may comprise at least one organic insulating material selected from the group consisting of polyimide, polyamide, acrylic resin, benzocyclobutene, and phenol resin by using spin coating. The insulating layer may comprise an inorganic insulating material selected from the group consisting of $SiO_2$, $SiNx$, $Al_2O_3$, $CuOx$, $Tb_4O_7$, $Y_2O_3$, $Nb_2O_5$, and $Pr_2O_3$ as well as the organic insulating material. Also, the insulating layer may be formed to have a multi-layer structure in which an organic insulating material and an inorganic insulating material are alternately arranged.

Holes H4 and H5 through which a central portion of the pixel electrode 108 and a central portion of the connection electrode 109 are respectively exposed are formed by patterning the insulating layer by using a mask process. A first opening 121 is formed by the hole H4, a second opening 122 is formed by the hole H5, at least a portion of the pixel electrode 108 is exposed through the first opening 121, and at least a portion of the connection electrode 109 is exposed through the second opening 122.

Figure 7:
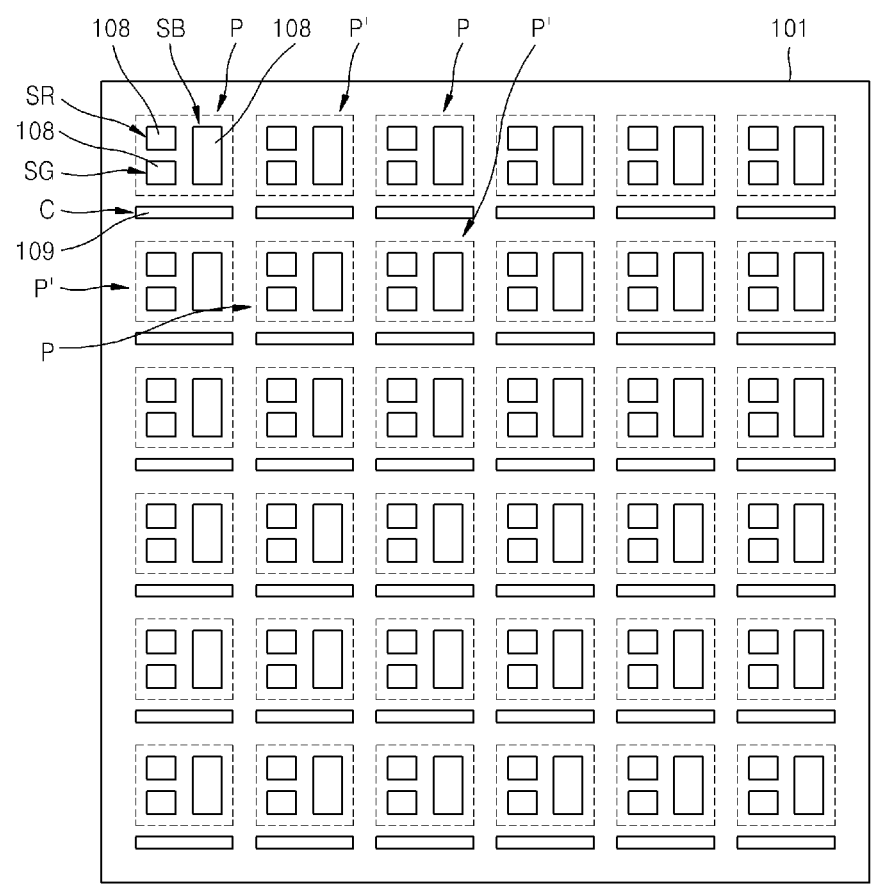

FIG. 7 is a plan view illustrating the substrate 101 on which the connection electrode 109 and the pixel electrode 108 are formed. Referring to FIG. 7, the pixel electrode 108 is formed on each of the red, green, and blue subpixel areas SR, SG, and SB, and the connection electrode 109 is formed on the connection area C. The pixel electrode 108 and the connection electrode 109 are partially respectively exposed through the first opening 121 and the second opening 122 as described above.

Figure 8:
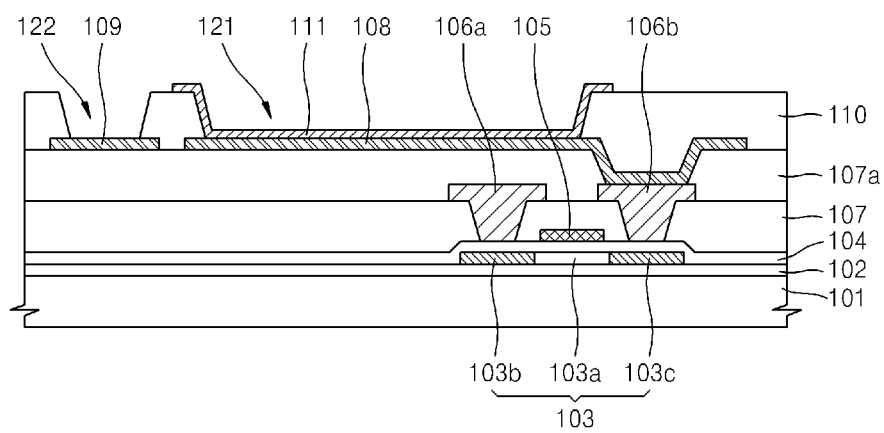

Referring to FIG. 8, a first common layer 111 is formed on the pixel electrodes 108. The first common layer 111 may be a p-doped hole injection layer (pHIL). However, the present embodiment is not limited thereto, and the first common layer 111 may have a structure in which a hole transport layer (HTL) and a hole injection layer (HIL) are stacked.

The first common layer 111 is formed on the pixel electrode 108, but is not formed on the connection electrode 109. As such, a patterned mask is used in order to form the first common layer 111 on the pixel electrode 108. That is, the first common layer 111 is formed on some pixel areas P by using a first mask 11, and the first common layer 111 is formed on the remaining pixel areas P' by using a second mask 12. Since the first common layer 111 is formed according to the pixel areas P or P', a thickness of the first common layer 111 formed on a plurality of subpixel areas within the same pixel area P or P' is uniform.

Figure 9:
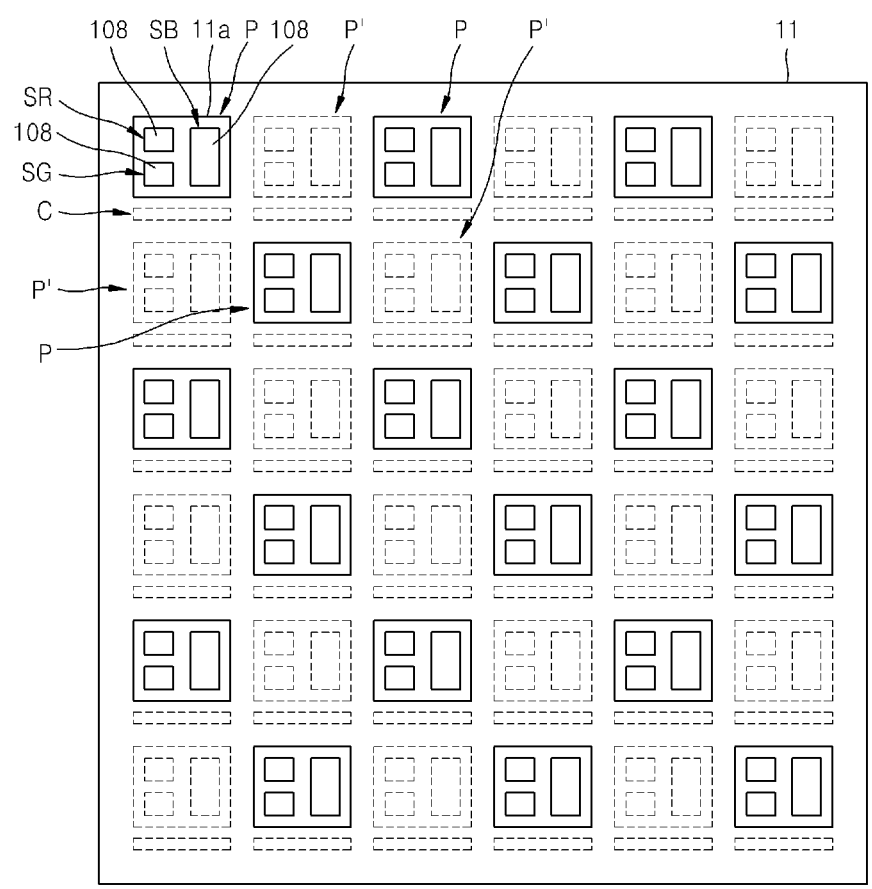
Figure 10:
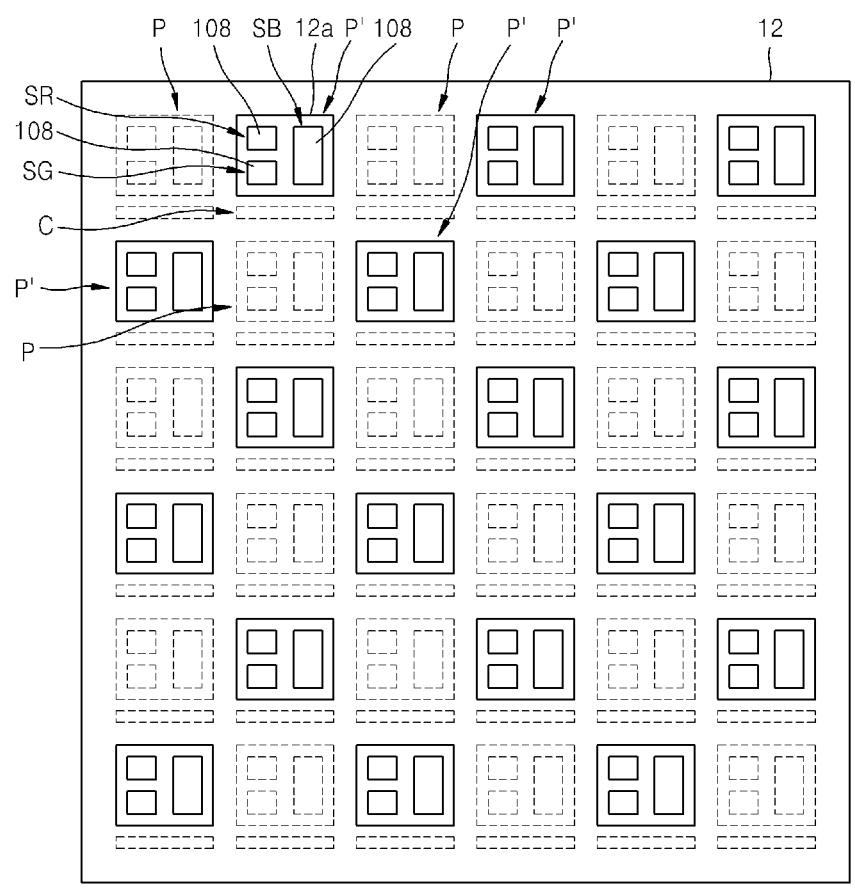

In detail, FIG. 9 is a plan view for explaining a first mask process for forming the first common layer 111. FIG. 10 is a plan view for explaining a second mask process for forming the first common layer 111.

Referring to FIGS. 9 and 10, in the first mask 11, openings 11a are formed such that the first common layer 111 is formed on one pixel area P and on the pixel areas P disposed in diagonal directions to said one pixel area P from among the plurality of pixel areas P and P' adjacent to said one pixel area P. That is, in the first mask 11, the opening 11a is formed to correspond to said one pixel area P, the openings 11a are not formed on the pixel areas P' adjacent in all directions except the diagonal directions to said one pixel area P, and the openings 11a are formed to correspond to the pixel areas P adjacent in all directions except the diagonal directions to the pixel areas P'. Accordingly, when the first mask 11 is aligned to the substrate 101, only said pixel area P and the pixel areas P disposed in diagonal directions to said one pixel area P from among the plurality of pixel areas P and P' adjacent to said one pixel area P are exposed by the openings 11a, and the pixel areas P' adjacent in all directions except the diagonal directions to the pixel areas P are not exposed.

The first mask process is a process of forming the first common layer 111 only on the pixel areas P by using the first mask 11.

Next, a second mask process forms the first common layer 111 on the pixel areas P' by using the second mask 12.

In the second mask 12, openings 12a are formed such that the first common layer 111 is formed on the pixel areas P' on which the first common layer 111 is not formed by using the first mask 11. That is, in the second mask 12, the opening 12a is formed to correspond to one pixel area P', the openings 12a are not formed on the pixel areas P adjacent in all directions except diagonal directions to said one pixel area P', and the openings 12a are formed to correspond to said pixel areas P' adjacent in all directions except the diagonal directions to the pixel areas P. Accordingly, when the second mask 12 is aligned to the substrate 101, only said pixel area P' and the pixel areas P' disposed in diagonal directions to said one pixel area P' from among the plurality of pixel areas P and P' adjacent to said one pixel area P' are exposed by the openings 11a, and the pixel areas P' adjacent in all directions except the diagonal directions to the pixel areas P are not exposed.

The second mask process is a process of forming the first common layer 111 only on the pixel areas P' by using the second mask 12 as shown in FIG. 10.

Figure 11:
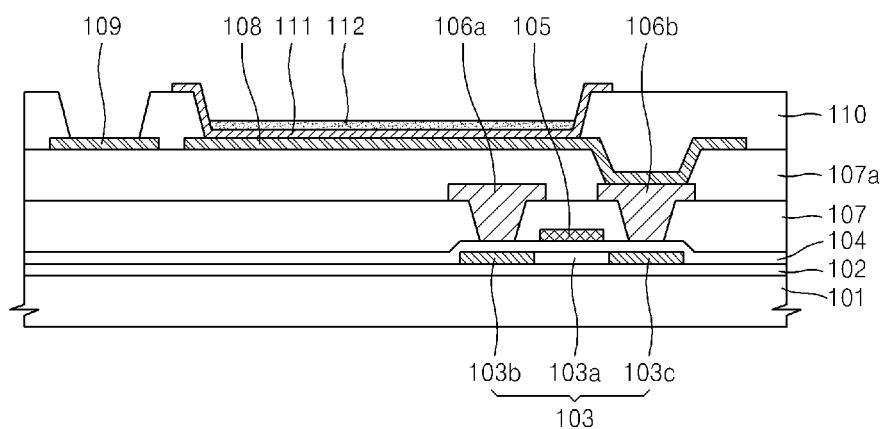

Referring to FIG. 11, an emission layer (EML) is formed on the first common layer 111.

The EML 112 may comprise a low-molecular weight organic material or a high-molecular weight organic material.

When the EML 112 comprises a low-molecular weight organic material, an HTL and an HIL may be stacked toward the pixel electrode 108 from the EML 112, and an ETL and an EIL may be stacked toward the counter electrode 114 from the EML 112. If necessary, other various layers may be stacked. In this case, examples of the low-molecular weight organic material may include copper phthalocyanine (CuPc), N,N'-Di(naphthalene-1-yl)-N,N'-diphenyl-benzidine (NPB), and tris-8-hydroxyquinoline aluminum (Alq3).

When the EML 112 comprises a high-molecular weight organic material, only a HTL may be disposed toward the pixel electrode 108 from the EML 112. The HTL may comprise poly-(2,4)-ethylene-dihydroxy thiophene (PEDOT) or polyaniline (PANI) on the pixel electrode 108 by using inkjet printing or spin coating. Examples of the high-molecular weight organic material may include a poly-phenylenevi-nylene (PPV)-based high molecular weight organic material and a polyfluorene-based high molecular weight organic materials. A color pattern may be formed by using a common method such as inkjet printing, spin coating, or heat transfer using laser.

Figure 12:
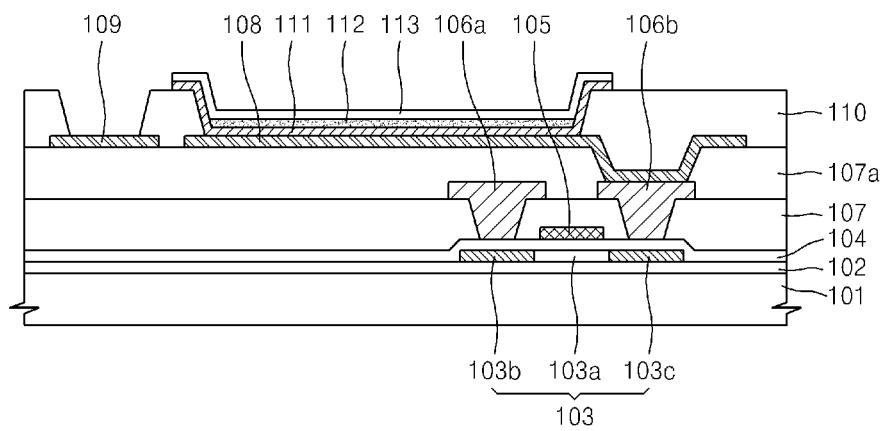

Referring to FIG. 12, a second common layer 113 is formed on the pixel areas P and P' to cover the EML 112. The second common layer 113 may be an ETL. However, the present embodiment is not limited thereto, and the second common layer 113 may be an ETL and an EIL.

The second common layer 113 is formed on the pixel areas P and P', but is not formed on the connection area C and thus is not deposited on the connection electrode 109. A patterned mask is used in order to form the second common layer 113 on the EML 112. That is, the second common layer 113 is formed on the pixel areas P by using a third mask 13, and then the second common layer 113 is formed on the pixel areas P' by using a fourth mask 114. Since the second common layer 113 is formed according to the pixel areas P or P', a thickness of the second common layer 113 formed on a plurality of subpixel areas within the same pixel area P or P' is uniform.

Figure 13:
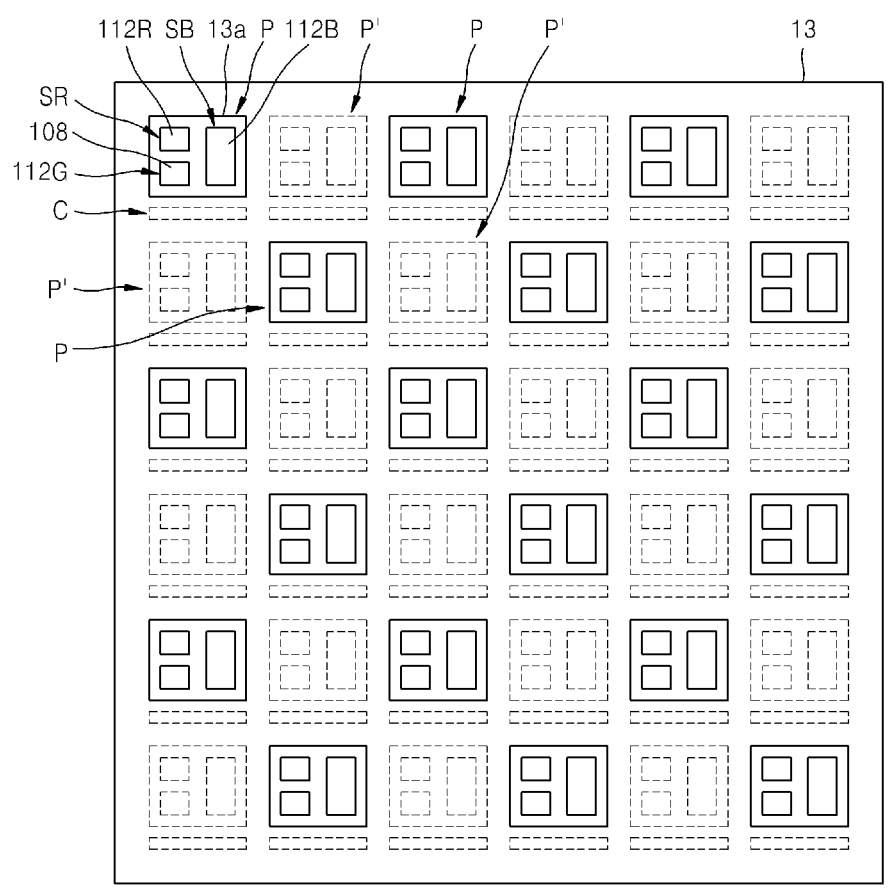
Figure 14:
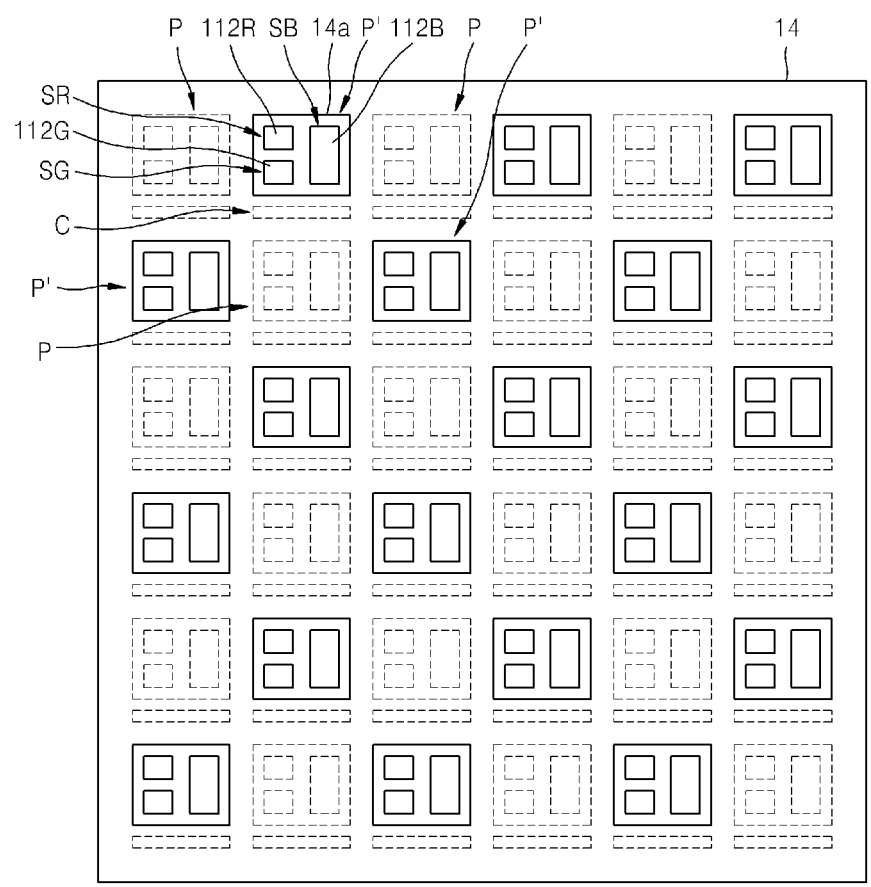

In detail, FIG. 13 is a plan view for explaining a third mask process for forming the second common layer 113. FIG. 14 is a plan view for explaining a fourth mask process for forming the second common layer 113.

Referring to FIGS. 13 and 14, in the third mask 13, openings 13a are formed such that the second common layer 113 is formed on one pixel area P and the pixel areas P disposed in diagonal directions to said one pixel area P from among the plurality of pixel areas P and P' adjacent to said one pixel area P. That is, in the third mask 13, the opening 13a is formed to correspond to said one pixel area P, the openings 13a are not formed on the pixel areas P' adjacent in all directions except the diagonal directions to the one pixel area P, and the openings 13a are formed to correspond to the pixel areas P adjacent in all directions except the diagonal directions to the pixel areas P'. Accordingly, when the third mask 13 is aligned to the substrate 101, only said pixel area P and the pixel areas P disposed in the diagonal directions to said one pixel area P from among the plurality of pixel areas P and P' adjacent to said one pixel area P are exposed by the openings 13a, and the pixel areas P' adjacent in all directions except the diagonal directions to the pixel areas P are not exposed.

The third mask process is a process of forming the second common layer 113 only on the pixel areas P by using the third mask 13.

Next, the fourth mask process forms the second common layer 113 on the pixel areas P' by using a fourth mask 14.

In the fourth mask 14, openings 14a are formed such that the second common layer 113 is formed on the pixel areas P' on which the second common layer 113 is not formed by using the third mask 13. That is, in the fourth mask 14, the opening 14a is formed to correspond to one pixel area P', the openings 14a are not formed on the pixel areas P adjacent in all directions except the diagonal directions to said one pixel area P', and the openings 14a are formed to correspond to the pixel areas P' adjacent in all directions except the diagonal directions to the pixel areas P. Accordingly, when the fourth mask 14 is aligned to the substrate 101, only said pixel area P' and the pixel areas P' disposed in the diagonal directions to said pixel area P' from among the plurality of pixel areas P and P' adjacent to said one pixel area P' are exposed by the openings 14a, and the pixel areas P adjacent in all directions except the diagonal directions to the pixel areas P' are not exposed.

The fourth mask process is a process of forming the second common layer 113 only on the other pixel areas P' by using the fourth mask 14 as shown in FIG. 14.

In an organic light-emitting display apparatus in which a connection electrode is connected to a counter electrode, since a common layer should not be formed on the connection electrode, a patterning mask may be used when the common layer is formed. The patterning mask for forming the common layer has problems in that since the patterning mask has to get larger as a size of a substrate increases, it is difficult to manufacture the patterning mask, and due to a precise pattern of the patterning mask, it is difficult to align the patterning mask on the substrate.

To solve the problems, the method of manufacturing the organic light-emitting display apparatus according to the present embodiment forms the first common layer 111 (or the second common layer 113) by using the first mask 11a and the second mask 12 (or the third mask 13 and the fourth mask 14), whose positions are different, of the openings 11a and 12a (or the openings 13a and 14a. Since in the first mask 11 (or the third mask 13), the openings 11a (or the openings 13a) are not formed on the pixel areas P' adjacent in all directions except the diagonal directions to any one pixel area P from among the plurality of pixel areas P and P' and the openings 11a are formed to correspond to the pixel areas P disposed in a direction diagonal except the diagonal directions to the pixel area P, and in the second mask 12 (or the fourth mask 14), the openings 12a (or the openings 14a) are formed on the pixel areas P' which are not exposed in the first mask 11 (or the third mask 13), the first through fourth masks 11a, 12a, 13a, and 14a may be more easily manufactured and may be more easily aligned to the substrate 101 than masks each having openings corresponding to all pixel areas in one mask.

Also, since a common layer is formed according to the pixel areas P and P' and thus a common layer formed on red, green, and blue subpixel areas within each of the pixel areas P and P' has substantially uniform thickness, white angular dependency (WAD) may be reduced. That is, WAD refers to color shift in a side viewing angle. When a thickness of a common layer varies according to subpixel areas within one pixel area, high WAD occurs. However, according to the organic light-emitting display apparatus manufactured by using the method of the present embodiment, since a thickness of a common layer is substantially uniform according to subpixel areas within one pixel area because the common layer is formed at the same time without discretion within one pixel area, WAD may be reduced.

Figure 15:
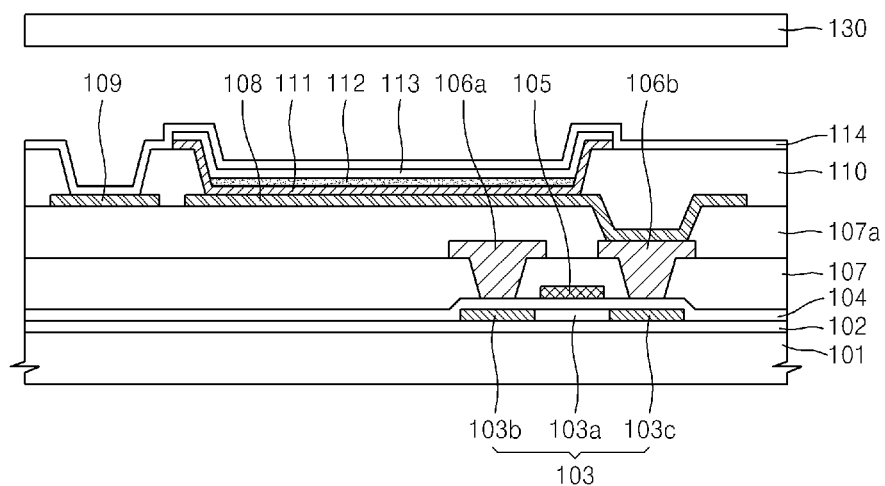

Referring to FIG. 15, a counter electrode 114 is formed on the substrate 101 to cover the second common layer 113 and to contact the connection electrode 109, and an encapsulation unit 130 is attached to the substrate 101. The counter electrode 114 may be formed as a common electrode by being deposited on the entire surface of the substrate 101. In the organic light-emitting display apparatus of the present embodiment, the pixel electrode 108 is used as an anode, and the counter electrode 114 is used as a cathode.

The counter electrode 114 may reduce a resistance of the counter electrode 114 by contacting the connection electrode 109.

According to the present embodiments, color shift of an organic light-emitting display apparatus may be prevented.

While the present embodiments have been particularly shown and described with reference to example embodiments thereof, it will be understood by those of ordinary skill in the art that various changes in form and details may be made therein without departing from the spirit and scope of the present embodiments as defined by the following claims.

What is claimed is:

1. An organic light-emitting display apparatus comprising:
   a substrate having a plurality of pixel areas, each of which has a plurality of subpixel areas;
   at least one thin film transistor (TFT) on each of the subpixel areas;
   a pixel electrode on each of the subpixel areas, the pixel electrode being electrically coupled to the TFT;
   a connection electrode not electrically coupled to the TFT;

a first common layer on each of the pixel areas, the first common layer being patterned to correspond to each of the pixel areas;

an emission layer on the first common layer, the emission layer being patterned to correspond to each of the subpixel areas;

a second common layer on each of the pixel areas, the second common layer being patterned to correspond to each of the pixel areas; and a counter electrode contacting the connection electrode and covering the second common layer and the connection electrode.

2. The organic light-emitting display apparatus of claim 1, wherein the subpixel areas comprise at least one of a red subpixel area, a green subpixel area, and a blue subpixel area.

3. The organic light-emitting display apparatus of claim 2, wherein one pixel area comprises the red subpixel area, the green subpixel area, and the blue subpixel area.

4. The organic light-emitting display apparatus of claim 1, wherein a thickness of the first common layer formed on the subpixel areas within one pixel area is substantially uniform on the subpixel areas.

5. The organic light-emitting display apparatus of claim 1, wherein the first common layer is a hole injection layer.

6. The organic light-emitting display apparatus of claim 1, wherein the first common layer is continuous within one pixel area.

7. The organic light-emitting display apparatus of claim 1, wherein a thickness of the second common layer formed on the subpixel areas within one pixel area is substantially uniform on the subpixel areas.

8. The organic light-emitting display apparatus of claim 1, wherein the second common layer is a electron transporting layer.

9. The organic light-emitting display apparatus of claim 1, wherein the second common layer is continuous within one pixel area.

10. The organic light-emitting display apparatus of claim 1, wherein the first common layer and the second common layer are patterned in a same shape.

11. The organic light-emitting display apparatus of claim 10, wherein the first common layer and the second common layer are continuous within one pixel area.

12. The organic light-emitting display apparatus of claim 10, wherein an edge of the first common layer coincide with an edge of the second common layer.

* * * * *